(12) United States Patent
Saiyan et al.

(10) Patent No.: US 12,310,143 B2
(45) Date of Patent: *May 20, 2025

(54) METHODS, SYSTEMS, AND APPARATUSES FOR PRODUCING, GENERATING AND UTILIZING POWER AND ENERGY

(71) Applicants: Yttrium Saiyan, Tyler, TX (US); Amethyst Saiyan, Tyler, TX (US)

(72) Inventors: Yttrium Saiyan, Tyler, TX (US); Amethyst Saiyan, Tyler, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/172,554

(22) Filed: Feb. 22, 2023

(65) Prior Publication Data
US 2023/0197875 A1 Jun. 22, 2023

Related U.S. Application Data

(63) Continuation-in-part of application No. 17/699,586, filed on Mar. 21, 2022, now abandoned.

(60) Provisional application No. 63/164,100, filed on Mar. 22, 2021.

(51) Int. Cl.
| | |
|---|---|
| *H10F 77/42* | (2025.01) |
| *H02S 40/22* | (2014.01) |
| *H10F 19/80* | (2025.01) |
| *H10F 77/30* | (2025.01) |
| *H10F 77/45* | (2025.01) |
| *H10F 77/50* | (2025.01) |

(52) U.S. Cl.
CPC ........... *H10F 77/488* (2025.01); *H02S 40/22* (2014.12); *H10F 19/804* (2025.01); *H10F 77/315* (2025.01); *H10F 77/45* (2025.01); *H10F 77/50* (2025.01)

(58) Field of Classification Search
CPC ......... H01L 31/02167; H01L 31/02168; H01L 31/02322; H01L 31/02327; H01L 31/048; H01L 31/0488; H01L 31/0547; H01L 31/055; H02S 40/22; H10F 77/488; H10F 77/50; H10F 77/315; H10F 77/45; H10F 19/80; H10F 19/804
See application file for complete search history.

(56) References Cited

U.S. PATENT DOCUMENTS

| | | | |
|---|---|---|---|
| 8,933,526 B2 | 1/2015 | Tsakalakos et al. | |
| 2010/0180932 A1* | 7/2010 | Wang | H01L 31/0547 136/246 |
| 2013/0104962 A1 | 5/2013 | Weibezahn | |

(Continued)

OTHER PUBLICATIONS

International Search Report and Written Opinion issued on Jun. 10, 2022 in corresponding International Patent Application No. PCT/US2022/021332; 7 pages.

*Primary Examiner* — Lindsey A Buck
(74) *Attorney, Agent, or Firm* — Maier & Maier, PLLC

(57) ABSTRACT

According to at least one exemplary embodiment an empyreal reaper may be provided. The empyreal reaper may include a packaging, one or more mirrors contained within the packaging which concentrate photonic energy from a photonic light source into focused light, one or more gain mediums which receive, on one or more absorption faces, the photonic energy concentrated by the one or more mirrors, and/or a photoelectric material which receives photonic energy from the one or more gain mediums and converts the photonic energy into electrical energy.

3 Claims, 2 Drawing Sheets

(56) References Cited

U.S. PATENT DOCUMENTS

| | | |
|---|---|---|
| 2016/0218235 A1 | 7/2016 | Binderbauer et al. |
| 2018/0342638 A1* | 11/2018 | Lambricht .......... H01L 31/0488 |
| 2019/0265571 A1 | 8/2019 | Phillips et al. |
| 2023/0197874 A1* | 6/2023 | Saiyan ................ H01L 31/0547 |
| | | 136/256 |

* cited by examiner

METHODS, SYSTEMS, AND APPARATUSES FOR PRODUCING, GENERATING AND UTILIZING POWER AND ENERGY

BACKGROUND

Currently solar energy collection involving solar panels is usually accomplished by placing solar panels in an array such that the surface of the panel is orthogonal to the incident rays from the sun. Furthermore, energy generation through photonic sources is limited in its efficiency, with one of the primary limiting factors being the amount of photonic energy initially collected.

SUMMARY

According to at least one exemplary embodiment methods, systems, and apparatuses for producing, generating, and utilizing power and energy may be provided. In some embodiments the system and apparatus for producing, generating, and utilizing power and energy may be an Empyreal Reaper. The empyreal reaper may include a packaging, one or more mirrors contained within the packaging which concentrate photonic energy from a photonic light source into focused light, one or more gain mediums which receive, on one or more absorption faces, the photonic energy concentrated by the one or more mirrors, and/or a photoelectric material which receives photonic energy from the one or more gain mediums and converts the photonic energy into electrical energy.

BRIEF DESCRIPTION OF THE FIGURES

Advantages of embodiments of the present invention will be apparent from the following detailed description of the exemplary embodiments. The following detailed description should be considered in conjunction with the accompanying figures in which.

DETAILED DESCRIPTION

Figure 1:
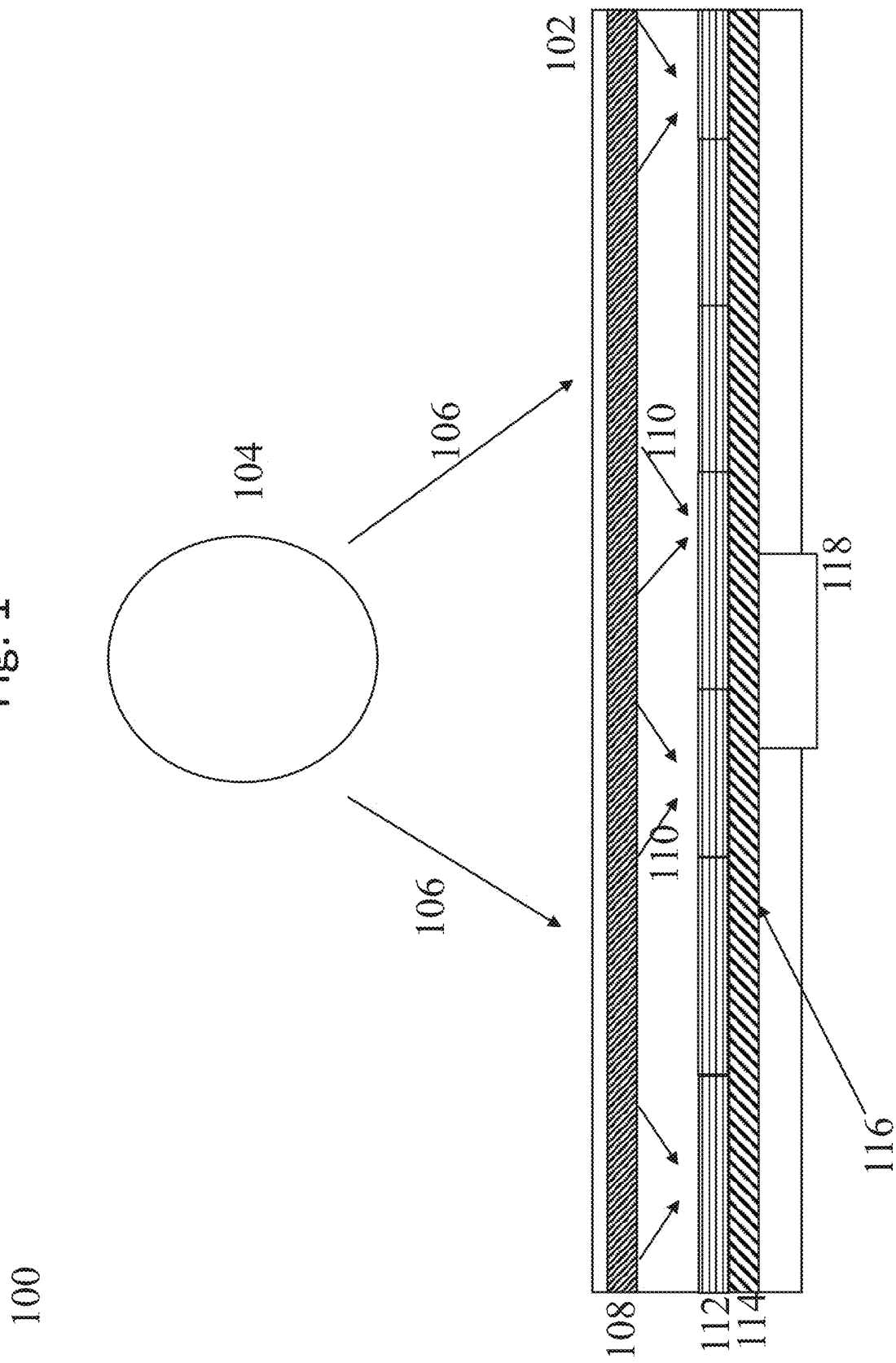
FIG. 1 shows an exemplary Empyreal Reaper.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation.

According to one or more embodiments an "Empyreal Reaper" 100 may be provided. In some embodiments the Empyreal Reaper 100 may be a system or apparatus for generating, producing, and utilizing power and energy.

As used herein "Saiyan emanation" means the stimulated emission of photons or photonic energy.

The Empyreal Reaper 100 may include a variety of different materials that allow for the conversion of photonic energy into electrical energy. The materials may include, but are not limited to, a composition of coatings, one or more mirrors 106, one or more gain media 112, a resin, and/or a photoelectric material 114. In an exemplary embodiment the Empyreal Reaper 100 may be configured in such a way that allows for the harnessing of photonic energy 106, and its conversion into usable electrical energy.

In an exemplary embodiment the Empyreal Reaper may concentrate solar energy and harness it as photonic energy 106. The exemplary embodiment may include a photonic energy source 104, which may be, for example, the sun or may be an artificial photonic energy source in addition to or instead of utilizing solar energy. In some embodiment the photonic energy source 104 may be the sun, in other embodiments the photonic energy source 104 may be an artificial photonic energy source such as, but not limited to, an LED, an array of LEDs, a laser, or any other artificial light source that emits photonic energy 106. The photonic energy 106 may be absorbed by the one or more mirrors 108 and emitted as focused energy 110. The one or more gain media 112 may absorb the focused energy 110, amplify it, and then emit it in a form most readily absorbable by the photoelectric material 114. The focused energy 110 may then be converted into useable electric energy. The usable electric energy may be carbonless which may contribute to decreasing the amount of harmful fossil fuels used by traditional electrical energy generation systems.

FIG. 1 may show an exemplary Empyreal Reaper 100. The Empyreal Reaper 100 may be enclosed in a casing 102. The casing 102 may be, for example, a hermetic package made of glass, which may protect the structure from environmental changes such as temperature or climate alterations. In other embodiments the packaging may be any material that can be hermetically sealed and is resilient to changes in climate, and may include for example but not limited to, titanium, aluminum, silver, gold, sapphire, and/or ceramics. The Empyreal Reaper 100 may also get the photonic light 106 from the photonic energy source 104. In some embodiment the photonic energy source 104 may be the sun, in other embodiments the photonic energy source 104 may be an artificial photonic energy source such as, but not limited to, an LED, an array of LEDs, a laser, or any other artificial light source that emits photonic energy 106.

The Empyreal Reaper 100 may further include the one or more mirrors 108 which absorb the photonic energy 106 and emit focused energy 110. The focused energy 110 may then be absorbed by the one or more gain media 112. The one or more gain mediums 112 may be connected to, or otherwise be able to transfer energy to, the photoelectric material 114, which may convert the energy into electrical energy. The electrical energy may be transferred via electrical circuitry that is controlled by a junction box 118. In different exemplary embodiments the Empyreal Reaper 100 may by constructed with different components and in different arrangements.

In an exemplary embodiment the circuitry may be configured in a way that regulates the onloading and offloading of electrons within the photoelectric material 114. These regulations will be tuned for the form factor of photonic energy 106 emitted by the one or more gain media 112 in away that allows for the greatest amount of photonic energy 106 to be efficiently converted into electrical energy.

In an exemplary embodiment, the Empyreal Reaper 100 may include the one or more mirrors 108. The one or more mirrors 108 may made of, for example but not limited to, silver, aluminum, copper, gold, a combination of these materials, or any other reflective composition that readily reflects light. The one or more mirrors 108 may be atomic mirrors that capture light at a variety of indices and emit the light as focused light 110, which may be, for example, a coherent beam. This may enable capturing of light at varying incident angles and emitting the light, so the emission has the incident angle most readily absorbable by the one or more gain media 112. This may allow for a larger portion of the photonic light 106 from the photonic energy source 104 to be absorbed while decreasing the reflection losses upon entry into the gain media 112.

In an exemplary embodiment a dichroic mirror may be utilized as one or more of the one or more mirrors 108. In some embodiments the mirror may be made into a dichroic mirror via the use of one or more coatings. The dichroic mirror may be made of a chemical composition of various materials that may be semipermeable to specific wavelengths of light. For instance, a wavelength specific to the one or more gain media's peak absorption bandgap may be selected for. The various materials may be composed of, for example, alternating layers of optical coatings that have varied refractive indices. The variation in indices may allow for the one or more mirrors 108 to produce phased reflections that are tuned to allow specific wavelengths of light to permeate the material, while reflecting all other wavelengths.

The dichroic mirror may further be tuned to reflect wavelengths of light that are within the gain media's 112 peak emission bandgap. The gain media 112 may emit energy generated from emanation with the gain media 112 in the form of light. By tuning the dichroic mirror to reflect back this light, loss of energy may be prevented. The dichroic mirror may also act as a layer of protection. The chemical or molecular composition of the dichroic mirror may reflect wavelengths of light that cause degradation within other materials within the Empyreal Reaper 100. Heat and infrared/ultraviolet spectrum light may be reflected to achieve substantial decrease in degradation.

If the dichroic mirror used it may be tuned to transmit light that is within the gain media's 112 peak absorption bandgap, while reflecting light that is within the gain media's 112 peak emission bandgap. By allowing for the seamless transmission of selected wavelengths of light, the potential for Saiyan Emanation within the gain media 112 may be created. Because the gain media 112 may have a high absorption efficiency for this specific bandgap of light, electrons throughout the structure may become energized. As the electrons become energized, they may move from their charged position to a discharged energy level. This movement of electrons may consequently release energy in the form of photons. These photons make up the photonic energy that is emitted from the gain medium. This newly emitted energy may then be prevented from exiting the top face of the gain media 112 because of the dichroic mirror. This photonic energy may then instead become focused on the face of the photoelectric material 114. The dichroic coating may also be tuned to reflect UV and infrared spectrum light as well, which may decrease the risk of damage to components of the Empyreal Reaper 100.

In another embodiment the one or more mirrors 108 may be coated with a cold mirror coating. The cold mirror coating may be, for example, a chemical composition of various materials tuned to reflect a high percentage of light within the UV spectrum, or any other spectrums of light that are unwanted within the solid-state exemplary embodiment at a specific incident angle (for example at a 45-degree incident angle). The coating may also be tuned to transmit a high percentage of light within the visual spectrum, or any other spectrum of light that is wanted within the solid-state exemplary embodiment at a specific incident angle (for example at a 45-degree incident angle).

The cold mirror coating may also simultaneously reflect the same light it may transmit when the wavelengths permeate the mirror at an opposing incident angle (for example at a 0-degree incident angle). This may be important for the spectrum of light that is within the peak absorption spectrum of the gain medium. When light in this absorption spectrum enters the coating at the specific incident angle, (for example at a 45-degree incident angle), the light may permeate the coating and enter the gain media 112. The light that is within the absorption spectrum but is not absorbed by the gain media 112 that would normally be reflected out of the system, may instead by reflected by the design of the cold mirror. This is because this light may exit the material at a specific incident angle (for example at a 0-degree incident angle). The one or more mirrors 108 may be tuned to these specific incident angles in order to capture wavelengths of light within the peak absorption spectrum of the gain media 108 and trap it within the system.

The cold mirror coating may allow for the creation of a virtual resonating cavity. Within the virtual resonating cavity, light of a specific bandgap may be absorbed into the gain media 112 and allowed to lase back and forth within the material. This may allow the photons to interact with molecules within the crystalline lattice structure of the gain media 112, and may allow for the release of energy in the form of stimulated and/or spontaneous emission. The cold mirror coating may be tuned to reflect and transmit specific wavelengths of light at a specific incident angle. When light that is within the peak absorption spectrum of the gain media 112 stimulates the mirror, it may permeate the material at a specific incident angle. Any light that is not absorbed readily by the gain media 112, may be reflected at a specific incident angle into the system for a second chance at absorption by the gain media 112. This may allow for Saiyan Emanation to take place within the gain media 112 as it reaches saturation potential.

The one or more mirrors 108 may allow for the creation of a virtual resonating cavity within the solid-state exemplary embodiment. This may be important for the gain media 112 as this may allow for Saiyan Emanation to take place within the Empyreal Reaper 100. In an embodiment the more light that is available for the gain media 112 to absorb reach saturation potential, the more photonic interactions may take place.

In another embodiment the one or more of the one or more mirrors 108 may be coated with an anti-reflective coating. The anti-reflective coating may be a chemical composition of various materials that may tuned to allow for wavelengths of light within the peak absorption bandgap of the gain media 112 to seamlessly pass through the material with minimal reflection losses. The allowing for a higher percentage of light within this specific spectrum may create the potential for Saiyan Emanation of newly generated photonic energy.

The anti-reflective coating may be composed of a variety of materials. The chemical or molecular compound may effectively transmit the specific wavelengths of light that are within the peak absorption bandgap of the gain media 112. The coating may also decrease the amount of photonic energy that is lost, while increasing the amount of available photonic energy to initiate the Saiyan emission within the gain media 112. This may be completed by the anti-reflective coating's ability to effectively produce two reflections that interfere destructively with one another allowing for a higher percentage of light within a specific bandgap to permeate the material with minimal reflection losses. The anti-reflective coating may also allow for excess light to escape once the system reaches energy saturation, which may decrease the potential for oversaturation to occur.

The antireflective coating may also allow for the seamless transmission of photonic energy within the peak absorption spectrum of both the gain medium 112 and the photoelectric material 114. The coating may be comprised of various materials that increase the transmissive ability of photonic energy by decreasing associated losses accompanied by reflection. This may increase the total amount of photonic energy that is able to enter the gain media 112, as well as the photoelectric material 114.

The Empyreal Reaper 100 may further include the one or more gain media 112. The gain media 112 may be, for example, crystalline lattice structures whose peak emission bandgap may match the peak absorption bandgap of the chemicals that make up the material with high photoexcitation characteristics. The crystalline lattice structure may also have a gain potential associated with its peak absorption bandgap. The gain potential may allow for the stimulated creation and emission of new photons. The new photons may then exit the material in the form of the gain media 112 peak emission bandgap.

The gain medium may be comprised of various chemical compounds that bind together in a mono or polycrystalline lattice structure. These may include synthetically grown or naturally occurring crystals that have certain optical properties. Some examples may include Nd: YAG, $Y^{2+}$: $CaF_2$, $Ti^{3+}$: $Al_2O_3$, Nd: KGW, or any crystal, ion-oxide, or metal oxide that has photoexcitation properties.

In some embodiments the gain media 112 may be cut, fabricated, polished, and/or coated in order to increase gain potential. The gain media 112 may be spherical, rectangular, triangular, or any other type of crystalline configuration that allows for the harnessing and amplification of photonic energy. The gain media 112 may be cut at a specific incident angle that may allow for the seamless transmission of light with minimal reflection losses. The gain media 112 may be cut at a specific incident angle that may allow for the seamless transmission of light with minimal reflection losses. This angle may be, for example, a Brewster angle, or any other type of configuration that decreases reflection and allows for seamless transmission of light.

In the gain media 112 the wavelengths allowed to permeate the material may allow for the potential for Saiyan emanation of newly generated photonic energy within the gain media 112. The wavelengths may be intrinsic to the peak absorption bandgap of the gain media 112. As the gain media 112 readily absorbs these wavelengths, the electrons within the crystalline lattice structure may become energized and displaced from their current energy level. The displacement of electrons and their movement from a charged to discharged position, is what may allow for the generation of new energy.

In some embodiments the gain media 112 may be coated with a resin, which may be a chemical composition of various materials that allow for the adhesion between the layers of the Empyreal Reaper 100. The resin may contain an index of refraction that is intrinsic to the index of refraction of the gain media 112, or any other material that the resin is adhering together. The matching of refractive indices may allow for the seamless transition of light from different layers of materials within Empyreal Reaper 100.

In some embodiments the gain media 112 may be coated with an encapsulant, which may be a chemical composition of various materials that allow for the adhesion between the layers of the Empyreal Reaper 100. The encapsulant may contain an index of refraction that is intrinsic to the index of refraction of the gain media 112, or any other material that the encapsulant is adhering together. The matching of refractive indices may allow for the seamless transition of light from different layers of materials within Empyreal Reaper 100. The encapsulant may also function as a protective layer, decreasing the risk for delamination, corrosion, and environmental damage within the solid-state exemplary embodiment.

In some embodiments the gain media 112 may be coated with antireflective coating which may be a chemical composition of various materials that contain varying refractive indices that are tuned to minimize reflection losses when specific wavelengths of light permeate a material. The chemical composition may be matched to the refractive indices of the varying materials within the Empyreal Reaper 100. The matching of refractive indices between materials may allow for a higher percentage of light to pass from one material to another with minimal losses resulting from reflection.

In some embodiments the gain media 112 may be coated with a highly reflective coating. The highly reflective coating may be located on the side opposite a dichromatic coating, which may allow for enhanced trapping of the gain media's primary excitation wavelengths.

In an exemplary embodiment, the gain media 112 may have Fano-resonant optical coating (FROC) placed on the absorption face that simultaneously transmits and reflects light of a particular incident angle and/or wavelength or bandgap that is most absorbable by the gain media 112. This optical coating may allow for the seamless collection and amplification of photonic energy 106 to occur within the gain media 112. Amplification of photonic energy 106 may occur within the gain media 112 by the ability of this FROC coating to transmit, capture, and lace photonic energy 106 back and forth within the material at a specific bandgap most reactive for the gain media 112. This FROC coating may also be placed on the emission side of the gain media 112 in a way that allows for the amplified photonic energy emitted by the gain media 112 at a specific incident angle and/or band gap most easily absorbed by the photoelectric material 114.

In some embodiments, the one or more gain media 112 may have a polarization coating deposited on the absorption face. The coating may be tuned for the gain media 112 to absorb the photonic energy 106 at an incident angle that allows for the greatest amount of absorption to occur within the material. The gain media 112 may have a polarization coating deposited on the emission side allowing the photonic energy 106 to be emitted in a form factor most desirable for the absorption by the photoelectric materials 114.

The Empyreal Reaper 100 may further include the photoelectric material 114. The photoelectric material 114 may be a chemical composition of various materials that become excited by photonic energy in the peak emission bandgap associated with the gain media 112. The excitation wavelength may stimulate the movement of free electrons from their bonded state, which may cause the free electrons to travel together in one coherent current. The current may be transferred from the photoelectric material 114 into, for example, circuitry components attached to the photoelectric material 114, at which point the photonic energy may have been converted into usable electrical energy.

The photoelectric material 114 may be composed of a variety of different chemical or molecular compositions including but not limited to, GaAs, InGaN, GaInP, polycrystalline silicon, SiN, CdTe, or any other chemical compound that may partake in the photoelectric effect. The material may have a peak absorption bandgap that matches the associated gain media's 112 peak emission bandgap.

In some embodiments the photoelectric material 114 may be adhered to the back of the gain media 112. This may be done, for example, using a resin whose index of refraction matches the gain media's 112 allowing for light to seamlessly pass through onto the face of the photoelectric material 114.

In an exemplary embodiment the photoelectric material 114 may be coated with a highly reflective coating. The highly reflective coating may act as a mirror that may have reflective capabilities for the wavelengths of light that are within the peak absorption bandgap of the gain media 112. The reflective coating may allow for the materials within the Empyreal Reaper 100 to reach their saturation capacities and increase the ability for the gain media 112 to undergo increased Saiyan Emissions.

The photoelectric material 114 may or may not have coatings deposited on either face. The photoelectric material 114 may absorb photonic energy either from ambient sunlight, and/or from the light emitted by the stimulated gain media 112. The photoelectric material 114 may also have a coating that allows for seamless transmission of photonic energy. This coating may be a dichromatic, antireflective, or any other type of coating design that allows for photonic energy within the peak absorption spectrum of the photoelectric material 114 to freely enter with minimal reflection losses. If using an antireflective coating, the coating may function as an index matching coating that decreases reflection losses when photonic energy exits the gain media 112 and enters the photoelectric material 114.

The photoelectric material 114 may have a coating on the back face of the photoelectric material 114. The coating may be a highly reflective coating, a dichroitic coating, or any other type of optical coating material that minimizes the amount of light that is lost through the back face 116. The trapping of photonic energy within the Empyreal Reaper 100 may allow for more photonic energy to become available within the device to either become absorbed into the photoelectric material 114, or to create Saiyan Emanation within the gain media 112.

In some embodiments the back face 116 may remain uncoated and instead may be used as another photonic emission absorption face. The back face 116 may absorb, for example, photonic energy reflected off the ground or off a mirror that is placed to reflect photonic energy into the back face 116. In an exemplary embodiment this may be known as bifacial pumping, where two or more faces of the Empyreal Reaper 100 are used to capture and absorb photonic energy.

In an exemplary embodiment a dichromatic coating may be used on one or more of the above components. The dichromatic coating may be composed of a variety of different materials. The chemical or molecular compound may be selectively permeable to light that is within the peak emission wavelengths of the sun or other photonic source 104. The wavelength consequently may also be within the bandgap of the solid-state device's gain media's 112 peak absorption. In an exemplary embodiment the coating may be applied to a polished surface of the gain media 112.

The Empyreal Reaper 100 may further include the junction box 118. The junction box 118 may digitalize the performance of one or more Empyreal Reapers 100. Associated panels may be able to be enabled or disabled through the junction box 118 through the use of software. there may also be opportunities for the system to be run by a computer and have certain parameters for electron flow that is regulated by computation.

In an embodiment the Empyreal Reaper 100 may have the ability to sustainably convert photonic energy into usable electrical energy. The various components may be made of a variety of materials that may have certain photoexcitation properties. For instance, the gain media 112 may be composed of various chemical compounds that together form a crystalline lattice structure that has photoexcitation properties. The molecular compound may have a specific orientation and lattice structure that allows for the process of spontaneous emission to be controlled and modified into Saiyan Emanation. When wavelengths of light that match the corresponding material's specific peak absorption range interact with the substrate (or photoelectric material 114), the photons may have the ability to indirectly interact with the electrons within the gain media 112. When this interaction takes place, the electron may become excited and become energized. As the electron moves, it may release energy in the form of photons. The newly generated photons may be synonymous with the newly generated light that is illuminated from the gain media 112. This newly generated light may be converted into usable, electrical energy by the photoelectric material 114.

In different embodiments the Empyreal Reaper 100 may use none, one, or several of the coatings described above, in any combination. The various coatings above may be applied by, for example, evaporating the chemical or molecular compound evenly across the surface the coating is being applied to. The evaporation may be done by, for example but not limited to, electron beam sputtering, electron beam physical vapor deposition, ion assisted deposition, ion beam sputtering, or any other type of optical coating process that allows for the effective distribution of the coatings.

In an exemplary embodiment ion beam sputtering may be used to apply one or more coatings. Ion beam sputtering may include using a vacuum chamber and a target material (a metal oxide or any other type of material that releases electrons), a high energy ion beam may then be directed at the target. The ions within the beam may transfer their momentum into the target material causing atoms or molecules to sputter off. The high energy atoms/molecules that may sputter off the target material may deposit onto the substrates. Uniform, high density coatings may be achieved due to the presence of low-pressure oxygen within the coating to re-oxidize any free molecule or atom that may have become dissociated during the sputtering process.

In an exemplary embodiment electron beam sputtering may be used to apply one or more coatings. Electron beam sputtering may be initiated by heating the coating material within a high vacuum chamber until it becomes vaporized. It may be heated through electron beam bombardment when using dielectrics, or it may be heated resistively when using metals. As the coating material vaporizes, vapor may then stream away and recondense onto the surface of the substrate intended for coating.

In an exemplary embodiment electron-beam physic vapor deposition may be used to apply one or more coatings. This may allow for coating at a high deposition rate without needing to heat the substrate at as high of temperatures. When the coating process is initiated an electron beam may be generated and accelerated to a high kinetic energy. The high energy beam may be directed at the evaporation material which may cause the electrons within the material to decrease to a lower energy level. Interactions with the evaporation material may cause the kinetic energy to covert into alternative forms of energy, such as thermal energy which may then cause the evaporation material to melt. The melting material may then vaporize and rise to coat the surface of the material being coated.

Figure 2:
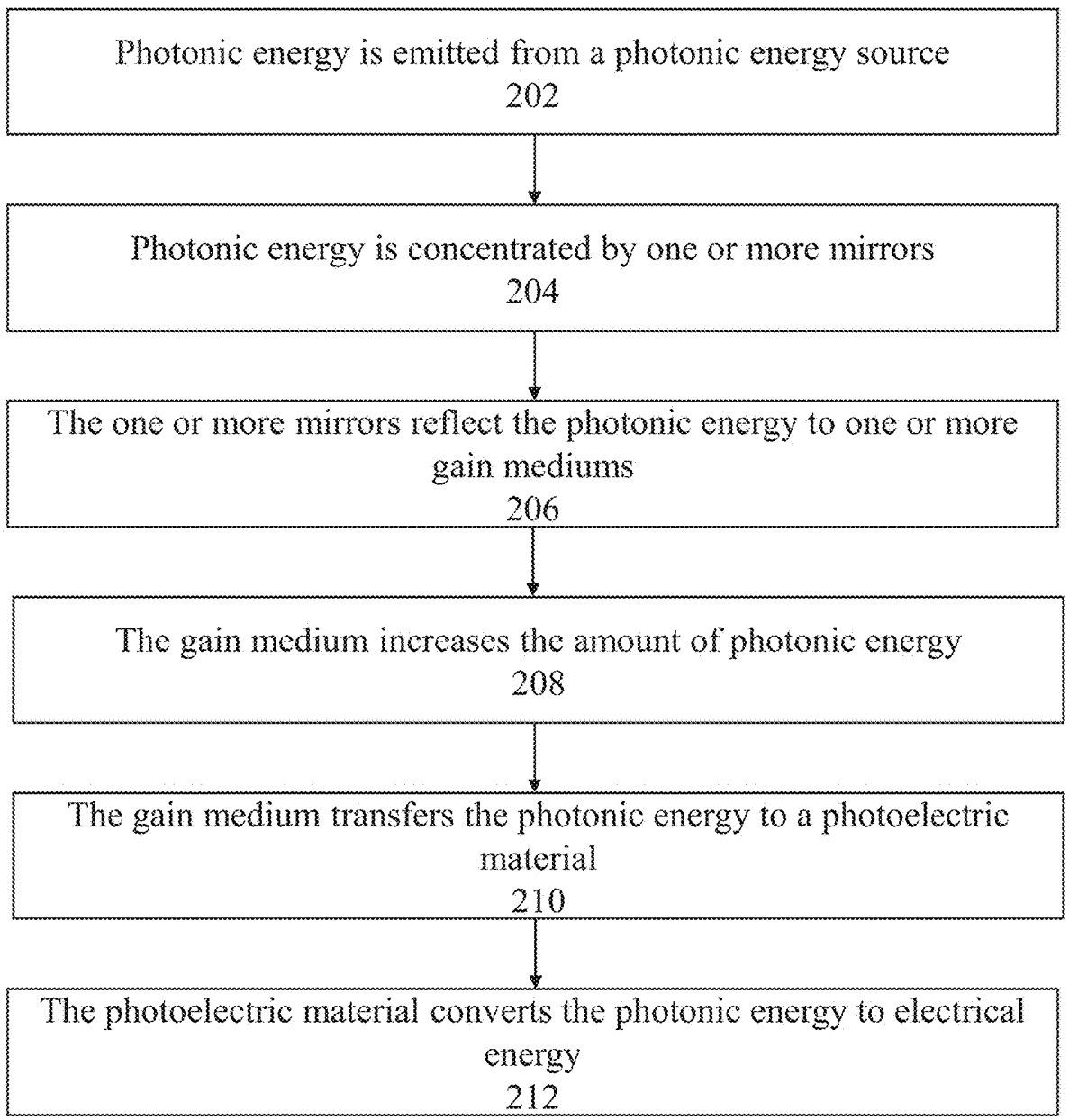
FIG. 2 shows an exemplary method for generating energy through the Empyreal Reaper.

FIG. 2 may show an exemplary method for generating energy through the empyreal reaper 200. In a first step 202 the photonic energy source 104 may emit photonic energy 106. In a next step 204 the photonic energy 106 may be collected and concentrated by the one or more mirrors 108. In a third step 206 the one or more mirrors 108 may reflect the photonic energy 106 so that the photonic energy 106 is concentrated on the absorption faces of one or more gain mediums 112. In a fourth step 208 the photonic energy may increase a gain within the one or more gain media 112, for example through chemical reaction or reflection off the crystalline structure of the one or more gain media 112. The gain may further be increased by the use of various coatings as described above. In a fifth step 210 the one or more gain media 112 may transfer energy to the photoelectric material 114, in some embodiments this may be direct transmission through contact, indirect transmission through emission, or through any other method known in the art. In a final step 212 the photoelectric material 114 may convert the received energy into electrical energy.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. An empyreal reaper for producing, generating, and utilizing power and energy, comprising:
    a packaging;
    one or more mirrors contained within the packaging which concentrate photonic energy from a photonic light source into focused light;
    one or more gain mediums which receive, on one or more absorption faces, the photonic energy concentrated by the one or more mirrors; and
    a photoelectric material which receives photonic energy from the one or more gain mediums and converts the photonic energy into electrical energy,
    wherein each of the one or more gain mediums are coated with a reflective coating;
    wherein the photoelectric material is coated with an index matching coating;
    wherein the one or more gain mediums have a crystalline structure selected from the group consisting of $Y^{2+}$: $CaF_2$, $Ti^{3+}$: $Al_2O_3$, and Nd: KGW, and comprising a Fano-resonant optical coating (FROC) on the one or more absorption faces of each of the one or more gain mediums, the FROC configured such that the photonic energy laces back and forth within the one or more gain mediums to produce a photonic energy gain.

2. The empyreal reaper of claim 1, wherein the one or more mirrors are coated with a dichromatic coating, an anti-reflective coating, and/or a reflective coating.

3. The empyreal reaper of claim 1, wherein the one or more mirrors are made out of at least one of silver, aluminum, copper, or gold.

* * * * *